(12) United States Patent  Fan

(10) Patent No.: US 12,386,218 B2
(45) Date of Patent: Aug. 12, 2025

(54) SPLICING DISPLAY DEVICE

(71) Applicant: TCL China Star Optoelectronics Technology Co., Ltd., Shenzhen (CN)

(72) Inventor: Yongping Fan, Shenzhen (CN)

(73) Assignee: TCL CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 17/793,397

(22) PCT Filed: Jun. 30, 2022

(86) PCT No.: PCT/CN2022/103119
§ 371 (c)(1),
(2) Date: Jul. 17, 2022

(87) PCT Pub. No.: WO2023/245717
PCT Pub. Date: Dec. 28, 2023

(65) Prior Publication Data
US 2025/0116895 A1  Apr. 10, 2025

(30) Foreign Application Priority Data

Jun. 22, 2022 (CN) .......................... 202210710895.2

(51) Int. Cl.
*G02F 1/1333*  (2006.01)
*H10H 29/80*  (2025.01)
(52) U.S. Cl.
CPC ....... *G02F 1/13336* (2013.01); *H10H 29/942* (2025.01)

(58) Field of Classification Search
CPC .......................... G02F 1/13336; H10H 29/942
See application file for complete search history.

(56) References Cited

U.S. PATENT DOCUMENTS

2022/0059608 A1  2/2022  Tseng
2024/0353709 A1* 10/2024  Fu .............................. G09F 9/33

FOREIGN PATENT DOCUMENTS

| CN | 109026923 A | 12/2018 |
| CN | 110379314 A | 10/2019 |
| CN | 111128051 A | 5/2020 |
| CN | 111290154 A | 6/2020 |
| CN | 111653207 A | 9/2020 |
| CN | 113270049 A | 8/2021 |

(Continued)

OTHER PUBLICATIONS

English Machine Translation of Fu et al., WO 2023230879 (Year: 2025).*

(Continued)

*Primary Examiner* — Donald L Raleigh
(74) *Attorney, Agent, or Firm* — Nathan & Associates Patent Agents Ltd.; Menachem Nathan

(57) ABSTRACT

A splicing display device is provided. The splicing display device includes at least two first display units and a second display unit. The first display units are spliced and connected. Each of the first display units includes a non-display area. The second display unit is disposed on a light-emitting side of the first display units, and attached and fixed to a splicing position of the non-display areas of the two adjacent first display units.

20 Claims, 3 Drawing Sheets

(56) References Cited

FOREIGN PATENT DOCUMENTS

| | | | | |
|---|---|---|---|---|
| CN | 113658984 A | * | 11/2021 | ......... G02F 1/13336 |
| CN | 113703211 A | | 11/2021 | |
| CN | 113763823 A | | 12/2021 | |
| CN | 114038340 A | | 2/2022 | |
| CN | 114141154 A | | 3/2022 | |
| CN | 114415410 A | | 4/2022 | |
| CN | 114488621 A | | 5/2022 | |
| JP | 2002062826 A | | 2/2002 | |
| WO | 2021255290 A1 | | 12/2021 | |
| WO | WO-2023230879 A1 | * | 12/2023 | ....... G02F 1/133331 |

OTHER PUBLICATIONS

English Machine Translation of Kong et al., CN 113658984 (Year: 2025).*
International Search Report in International application No. PCT/CN2022/103119, mailed on Dec. 16, 2022.
Written Opinion of the International Search Authority in International application No. PCT/CN2022/103119, mailed on Dec. 16, 2022.
Chinese Office Action issued in corresponding Chinese Patent Application No. 202210710895.2 dated Mar. 31, 2023, pp. 1-7.

* cited by examiner

SPLICING DISPLAY DEVICE

FIELD OF DISCLOSURE

The present disclosure relates to the field of display technologies, in particular to a splicing display device.

BACKGROUND

At present, it is one of ways to realize seamless splicing of viewing angles of large-size display screens by arranging light-emitting diode strips correspondingly at a splicing position of two liquid crystal display panels which are connected and spliced. However, a flatness of the light-emitting diode strips fixed on the liquid crystal display panel directly affects s display performance of the large-size display screens.

SUMMARY OF DISCLOSURE

A purpose of the present disclosure is to provide a splicing display device to improve a flatness of a splicing position of non-display areas of two adjacent first display units where a second display unit is fixed to.

A splicing display device includes:

at least two first display units which are spliced and connected, where each of the first display units includes a non-display area; and a second display unit disposed on a light-emitting side of the first display units, and attached and fixed to a splicing position of the non-display areas of the two adjacent first display units.

In the splicing display device of some embodiments, the splicing display device further includes:

a vacuum suction component disposed in the non-display area of one of the first display units and arranged corresponding to the second display unit, where the vacuum suction component is configured to attach the second display unit; and a vacuuming unit disposed on a side of the one of the first display units away from the second display unit, where the vacuuming unit is connected to the vacuum suction component, and is configured to vacuum the vacuum suction component.

In the splicing display device of some embodiments, the vacuum suction component includes a suction hole, and the suction hole extends in a thickness direction of the first display units.

The splicing display device further includes a connecting pipe, one end of the connecting pipe is connected to the vacuuming unit, and another end of the connecting pipe is inserted into the suction hole.

In the splicing display device of some embodiments, each of the first display units further includes:

a first accommodating slot disposed in the non-display area of the first display unit, disposed on a surface of the first display unit close to the second display unit, and arranged corresponding to the second display unit; and a through hole correspondingly arranged and communicated with the first accommodating slot, and extending in a thickness direction of the first display unit.

The vacuum suction component includes a vacuum sucker and is disposed in the first accommodating slot.

The splicing display device further includes a connecting pipe, at least a portion of the connecting pipe is disposed in the through hole, one end of the connecting pipe is connected to the vacuum sucker, and another end of the connecting pipe is connected to the vacuuming unit.

In the splicing display device of some embodiments, the first display units are liquid crystal display modules, and the second display unit is a light emitting-diode light panel.

In the splicing display device of some embodiments, each of the first display units includes a liquid crystal display panel and a backlight module, the backlight module includes a backplane, the backplane includes a bottom plate and a side plate arranged along an edge of the bottom plate, the side plate of the backplane is arranged around the liquid crystal display panel, the side plate of the backplane is disposed in the non-display area of the first display unit, and the vacuum suction component is disposed in the side plate.

In the splicing display device of some embodiments, the splicing display device further includes:

a vacuum valve connected between the vacuum suction component and the vacuuming unit.

In the splicing display device of some embodiments, a group of the vacuum suction components is correspondingly disposed on the splicing position of the non-display area of one of the two adjacent first display units, the group of the vacuum suction components includes a plurality of the vacuum suction components, one of the vacuum valves is connected to the group of the vacuum suction components.

In the splicing display device of some embodiments, two groups of the vacuum suction components respectively disposed on the splicing position of the non-display areas of the two adjacent first display units are symmetrically arranged.

In the splicing display device of some embodiments, the plurality of the vacuum suction components of the group of the vacuum suction components are arranged side by side along an extending direction of a splicing seam of the splicing position.

In the splicing display device of some embodiments, each of the first display units includes:

a second accommodating slot disposed on a rear surface of the first display unit away from the second display unit.

The vacuum valve is detachably fixed in the second accommodating slot.

In the splicing display device of some embodiments, the splicing display device further includes:

a rear casing disposed on a back side of light-emitting surfaces of at least two of the first display units which are spliced, where the rear casing includes an accommodating cavity, and the vacuum valve and the vacuuming unit are arranged in the accommodating cavity of the rear casing.

The present disclosure provides the splicing display device. By attaching and fixing the second display unit to a splicing position of the non-display areas of the two adjacent first display units, a flatness of the splicing position the non-display areas of the two adjacent first display units where the second display unit is fixed to is improved, thereby improving a display performance of the splicing display device.

DETAILED DESCRIPTION

Technical solutions in the embodiments of the present disclosure will be clearly and completely described below with reference to the accompanying drawings in the embodiments of the present disclosure. Obviously, the described embodiments are only some, but not all, embodiments of the present disclosure. Based on the embodiments in the present disclosure, all other embodiments obtained by those skilled in the art without creative efforts shall fall within a protection scope of the present disclosure.

Figure 1:
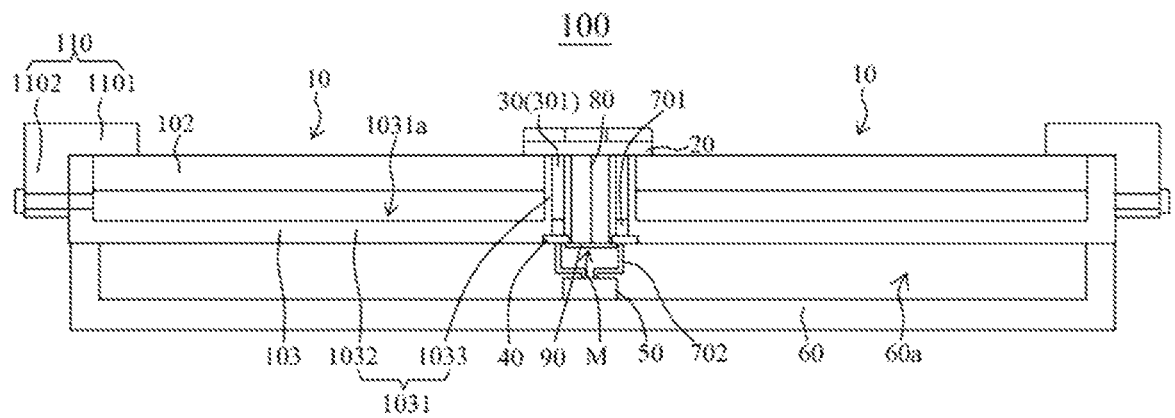
FIG. 1 is a schematic cross-sectional view of a splicing display device according to an embodiment of the present disclosure.
Figure 2:
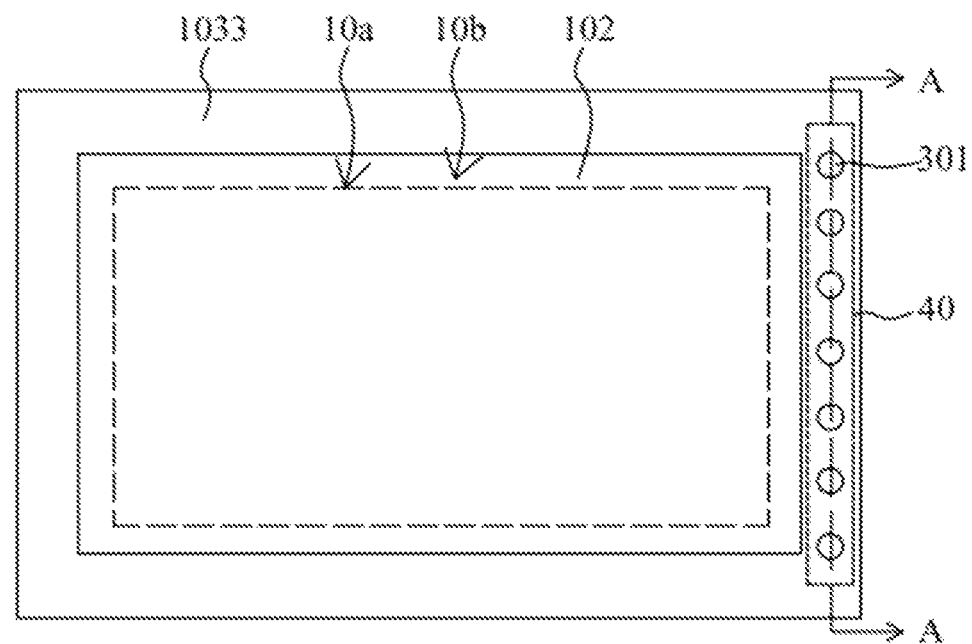
FIG. 2 is a schematic plan view of a first display unit and a vacuum valve in the splicing display device shown in FIG. 1.
Figure 3:
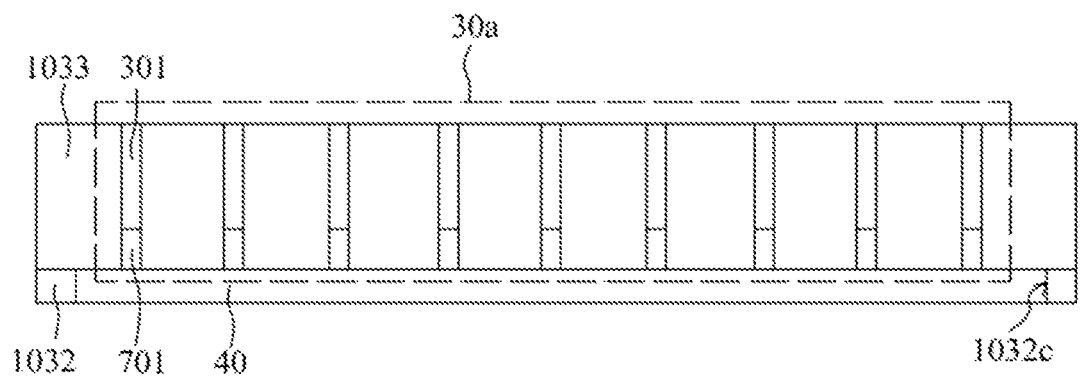
FIG. 3 is a schematic cross-sectional view along a line A-A shown in FIG. 2.

Referring to FIG. 1, FIG. 2, and FIG. 3, the present disclosure provides a splicing display device 100. The splicing display device 100 includes at least two first display units 10, a second display unit 20, a vacuum suction component 30, a vacuum valve 40, a vacuum unit 50, a rear casing 60, a first connecting pipe 701, and a second connecting pipe 702.

The first display units 10 are configured to display. Each of the first display units 10 includes a display area 10a and a non-display area 10b. The non-display area 10b is disposed at a periphery of the display area 10a and is arranged around the display area 10a.

The first display units 10 are liquid crystal display modules. Each of the first display units 10 includes a liquid crystal display panel 102 and a backlight module 103 disposed on a back side of a light-emitting surface of the liquid crystal display panel 102.

The backlight module 103 includes a backplane 1031, a light plate, a diffuser plate, an optical film, and the like. The backplane 1031 includes a bottom plate 1032 and four first side plates 1033. The bottom plate 1032 is rectangular. The four first side plates 1033 are arranged along four edges of the bottom plate 1032. The four first side plates 1033 and the bottom plate 1032 are surrounded to form a first accommodating cavity 1031a. The light plate, the diffuser plate, and the optical film etc. are arranged in the first accommodating cavity 1031a.

The liquid crystal display panel 102 is fixed on a first side plate 1033 of the backplane 1031. The first side plate 1033 is disposed around the liquid crystal display panel 102. A display area of the liquid crystal display panel 102 is the display area 10a of the first display unit 10. The non-display area 10b of the first display unit 10 includes a non-display area of the liquid crystal display panel 102. The non-display area 10b of the first display units 10 is provided with the first side plate 1033 of the backplane 1031.

It can be understood that the first display units 10 may also be micro light emitting diode display devices, sub-millimeter light emitting diode display devices, organic light emitting diode display devices or quantum dot display devices.

At least two first display units 10 may be spliced and connected along a same direction, or may be spliced and connected along two perpendicularly intersecting directions. Specifically, at least two first display units 10 are spliced and connected in the same direction. The two adjacent spliced first display units have a splicing position M. The splicing position M includes a splicing seam and the non-display areas 10b of the first display units 10.

In order to prevent the splicing seam of the splicing position M of the two adjacent spliced first display units and the non-display areas 10b of the first display units 10 from being viewed by human eyes, each second display unit 20 is disposed on the light-emitting side of the first display units, and is attached and fixed to the splicing position M of the non-display area 10b of the two adjacent first display units 10.

The second display unit 20 is a light emitting-diode light panel. The second display unit 20 includes a substrate and a plurality of inorganic light-emitting diodes arranged on the substrate. The substrate is a printed circuit board, and the inorganic light-emitting diodes can be micro light-emitting diodes or sub-millimeter light-emitting diodes.

The splicing display device 100 further includes a flexible printed circuit board 80 and a control circuit board 90. One end of the flexible printed circuit board 80 is connected to a rear surface of the light-emitting surface of the second display unit 20, and another end of the flexible printed circuit board 80 is connected to the control circuit board 90, so that the control circuit board 90 can control the second display unit 20 to emit light.

The splicing display device 100 also includes a middle frame 110. The middle frame 110 includes a frame body 1101 and four second side plates 1102 connected with the frame body 1101. The frame body 1101 is a rectangular frame body. The frame body 1101 is disposed on a side of the liquid crystal display panel 102 away from the backlight module 103 and is parallel to the liquid crystal display panel 102. The frame body 1101 is disposed in the non-display area of the splicing display device 100. An opening of the frame body 1101 overlaps with the display areas 10a of the at least two first display units 10 and the second display unit 20. The four second side plates 1102 are vertically connected to the frame body 1101. The four second side plates 1102 are disposed one-to-one with the four first side plates 1033 and are disposed at a periphery of the four first side plates 1033. The second side plate 1102 is detachably fixed on the first side plate 1033.

The rear casing 60 is disposed on a back side of the at least two spliced first display units 10. The rear casing 60 is detachably fixed to a rear surface of the first display units 10. The rear casing 60 includes a second accommodating cavity 60a. Specifically, the rear casing 60 is detachably fixed on the bottom plate 1032 of the backplane 1031.

In this embodiment, the splicing seam of the splicing position M and the non-display areas 10b of the first display units 10 are blocked by the second display unit 20. The second display unit 20 displays, which prevents the splicing seam of the splicing position M of the two adjacent spliced first display units and the non-display areas 10b of the first display units 10 from being viewed by the human eye. Moreover, for bonding the second display unit and the first display unit with an adhesive layer with a thickness of millimeters, unevenness and fixing problems are caused due to the uneven thickness of the adhesive layer. Compared with the above, in this embodiment, since each second display unit 20 is fixed to the non-display area 10b of the first display unit 10 by suction, the second display unit 20 can be fixed to the non-display area 10b of the first display unit 10 flatly, thereby improving the display performance of the splicing display device 100.

The vacuum suction component 30 is configured to attach the second display unit 20. The vacuum suction component 30 is disposed in the non-display area 10b of the first display unit 10, and is arranged corresponding to the second display unit 20.

Referring to FIG. 2 and FIG. 3, a group of the vacuum suction components 30a are correspondingly disposed in the splicing position M of the non-display areas 10b of two adjacent first display units 10. The group of the vacuum suction components 30a includes a plurality of the vacuum suction components 30.

The plurality of vacuum suction components 30 of the group of vacuum suction components 30a are arranged side by side along an extending direction of the splicing seam. The plurality of vacuum suction components 30 of the group of vacuum suction components 30a may also be arranged in a single row, two rows, or multiple rows. The plurality of vacuum suction components 30 of the group of vacuum suction components 30a may also be arranged in a rectangular or other shape.

When the plurality of vacuum suction components 30 of the group of vacuum suction components 30a are arranged side by side along the extension direction of the splicing seam, a distance between any two adjacent vacuum suction components 30 is equal in the extension direction of the splicing seam.

Two groups of the vacuum suction components 30a respectively disposed on the splicing position M of the non-display areas 10b of the two adjacent first display units 10 are symmetrically arranged. Suction forces of the two groups of the vacuum suction components 30a to the second display unit 20 are the same, and the second display unit 20 can be fixed to the non-display areas 10b of the two adjacent first display units 10 more smoothly.

The vacuum suction component 30 includes a suction hole 301. The suction hole 301 is disposed on the first side plate 1033 of the backplane 1031 close to the splicing seam. The suction hole 301 extends in a thickness direction of the first display units 10 and extends through the first side plate 1033.

The suction hole 301 is a cylindrical hole. It can be understood that the suction hole 301 may also be a quadrangular prism hole or a triangular prism hole.

The vacuuming unit 50 is configured to vacuum the vacuum suction component 30. The vacuuming unit 50 is disposed on a side of the first display unit 10 away from the second display unit 20. The vacuuming unit 50 is arranged in the second accommodating cavity 60a of the rear casing 60. The vacuuming unit 50 may be a vacuum compressor.

The vacuum valve 40 is configured to adjust a negative pressure condition in the vacuum suction component 30. The vacuum valve 40 is connected between the vacuum suction component 30 and the vacuuming unit 50. One vacuum valve 40 is connected to one group of the vacuum suction components 30a.

Specifically, one ends of the plurality of first connecting pipes 701 are connected to the plurality of first ends of the vacuum valves 40 one-to-one. Another ends of the first connecting pipe 701 are inserted into the suction holes 301. There is good sealing between the another end of the first connecting pipe 701 and the suction hole 301, which is beneficial to maintain the negative pressure condition in the vacuum suction component 30. One end of the second connecting pipe 702 is connected to the second end of the vacuum valve 40. Another end of the second connecting pipe 702 is connected to the vacuuming unit 50. Both the first connecting pipe 701 and the second connecting pipe 702 are plastic flexible pipes, which can be configured to allow gas to pass through.

As shown in FIG. 3, the first display unit 10 includes a second accommodating slot 1032c. The second accommodating slot 1032c is disposed on a rear surface of the first display unit 10 away from the second display unit 20. The second accommodating slot 1032c corresponds to the vacuum suction component 30. The vacuum valve 40 is detachably fixed in the second accommodating slot 1032c.

Specifically, the second accommodating slot 1032c is disposed on a surface of the bottom plate 1032 of the backplane 1031 away from the liquid crystal display panel 102, and the vacuum valve 40 is disposed in the second accommodating slot 1032c.

It is understood that the vacuum valve 40 may also be disposed in the second accommodating cavity 60a of the rear casing 60.

In the splicing display device of this embodiment, the suction hole 301 is vacuumed by the vacuuming unit 50, so that a pressure in the suction hole 301 is lower than an atmospheric pressure. Under an action of a pressure difference between the pressure in the suction hole 301 and the atmospheric pressure, the second display unit 20 is attached on the suction hole 301, so that the second display unit 20 is attached and fixed to the non-display area 10b of the first display unit 10. Moreover, the vacuum valve 40 can adjust the negative pressure condition in the suction hole 301, thereby adjusting a flatness of the non-display area 10b of the first display unit 10 where the second display unit 20 is attached and fixed to.

Figure 4:
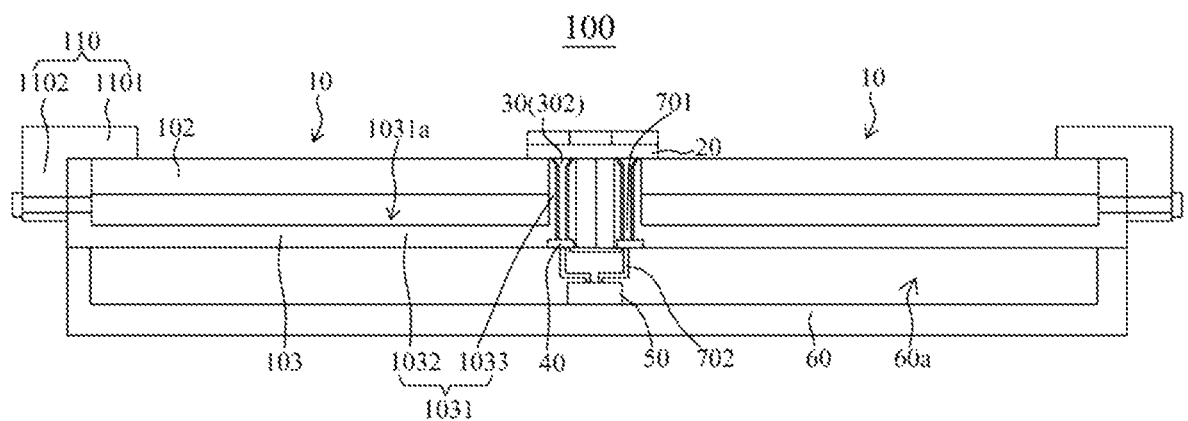
FIG. 4 is a schematic cross-sectional view of a splicing display device according to another embodiment of the present disclosure.
Figure 5:
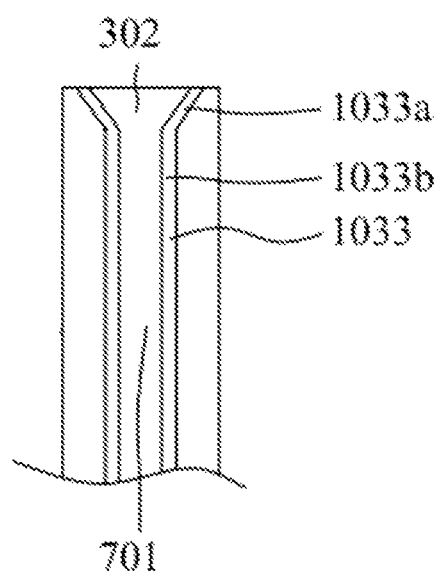
FIG. 5 is a partially enlarged schematic view of the splicing display device shown in FIG. 4.

Referring to FIG. 4 and FIG. 5, the splicing display device shown in FIG. 4 is basically similar to the splicing display device shown in FIG. 1, a difference is that the first display unit 10 further includes a first accommodating slot 1033a and a through hole 1033b. The first accommodating slot 1033a is disposed on a surface of the first display unit 10 adjacent to the second display unit 20. The first accommodating slot 1033a is disposed in the non-display area 10b of the first display unit 10 and is arranged corresponding to the second display unit 20. The through hole 1033b corresponds to the first accommodating slot 1033a and they are communicated with each other. The through hole 1033b extends in a thickness direction of the first display units 10. The vacuum suction component 30 includes a vacuum sucker 302. The vacuum sucker 302 is disposed in the first accommodating slot 1033a. The first connecting pipe 701 is disposed in the through hole 1033b. One end of the first connecting pipe 701 is connected to the vacuum sucker 302. Another end of the first connecting pipe 701 is connected to the vacuum valve 40. The second connecting pipe 702 connects the vacuum valve 40 and the vacuuming unit 50. The second connecting pipe 702 is disposed in the second accommodating cavity 60a of the rear casing 60.

Specifically, the first accommodating slot 1033a and the through hole 1033b are disposed on the first side plate 1033 of the backplane 1031. The first accommodating slot 1033a is disposed on a surface of the first side plate 1033 close to the second display unit 20. An area of a cross-section of the first accommodating slot 1033a in a direction parallel to the bottom plate 1032 decreases from being close to the second display unit 20 to being away from the second display unit 20. The first accommodating slot 1033a is funnel-shaped. The through hole 1033b extends in the thickness direction of the first display units 10. The through hole 1033b communicates with the first accommodating slot 1033a. A shape of the vacuum sucker 302 is the same as that of the first accommodating slot 1033a. The vacuum sucker 302 is disposed in the first accommodating slot 1033a. One end of the first connecting pipe 701 is connected to vacuum sucker 302. Another end of the first connecting pipe 701 is connected to the vacuum valve 40. The second connecting pipe 702 connects the vacuum valve 40 and the vacuuming unit 50. The second connecting pipe 702 is disposed in the second accommodating cavity 60a of the rear casing 60.

In this embodiment, the vacuum sucker 302 is configured to attach the second display unit 20, which is beneficial to improve an attaching effect of the second display unit 20.

The descriptions of the above embodiments are only used to help understand the technical solutions and core ideas of the present disclosure. Those of ordinary skill in the art should understand that they can still make modifications to the technical solutions described in the foregoing embodiments, or perform equivalent replacements to some of the technical features. These modifications or replacements do not make the essence of the corresponding technical solutions deviate from the scope of the technical solutions of the various embodiments of the present disclosure.

What is claimed is:

1. A splicing display device, comprising:
   at least two first display units which are spliced and connected, wherein each of the first display units comprises a non-display area, and the first display units are liquid crystal display modules; and
   a second display unit disposed on a light-emitting side of the first display units, and attached and fixed to a splicing position of the non-display areas of the two adjacent first display units, wherein the second display unit comprises a substrate and a plurality of inorganic light-emitting diodes disposed on the substrate, and the inorganic light-emitting diodes are micro light-emitting diodes or sub-millimeter light-emitting diodes;
   a vacuum suction component disposed in the non-display area of one of the first display units and arranged corresponding to the second display unit, wherein the vacuum suction component is configured to attach the second display unit.

2. The splicing display device according to claim 1, wherein further comprising:
   a vacuuming unit disposed on a side of the one of the first display units away from the second display unit, wherein the vacuuming unit is connected to the vacuum suction component, and is configured to vacuum the vacuum suction component.

3. The splicing display device according to claim 2, wherein the vacuum suction component comprises a suction hole, and the suction hole extends in a thickness direction of the first display units; and
   the splicing display device further comprises a connecting pipe, one end of the connecting pipe is connected to the vacuuming unit, and another end of the connecting pipe is inserted into the suction hole.

4. The splicing display device according to claim 2, wherein each of the first display units further comprises:
   a first accommodating slot disposed in the non-display area of the first display unit, disposed on a surface of the first display unit close to the second display unit, and arranged corresponding to the second display unit; and
   a through hole correspondingly arranged and communicated with the first accommodating slot, and extending in a thickness direction of the first display unit;
   wherein the vacuum suction component comprises a vacuum sucker and is disposed in the first accommodating slot; and
   wherein the splicing display device further comprises a connecting pipe, at least a portion of the connecting pipe is disposed in the through hole, one end of the connecting pipe is connected to the vacuum sucker, and another end of the connecting pipe is connected to the vacuuming unit.

5. The splicing display device according to claim 1, wherein each of the first display units comprises a liquid crystal display panel and a backlight module, the backlight module comprises a backplane, the backplane comprises a bottom plate and a side plate arranged along an edge of the bottom plate, the side plate of the backplane is arranged around the liquid crystal display panel, the side plate of the backplane is disposed in the non-display area of the first display unit, and the vacuum suction component is disposed in the side plate.

6. The splicing display device according to claim 2, further comprising: a vacuum valve connected between the vacuum suction component and the vacuuming unit.

7. The splicing display device according to claim 6, wherein a group of the vacuum suction components is correspondingly disposed on the splicing position of the non-display area of one of the two adjacent first display units, the group of the vacuum suction components comprises a plurality of the vacuum suction components, one of the vacuum valves is connected to the group of the vacuum suction components.

8. The splicing display device according to claim 7, wherein two groups of the vacuum suction components respectively disposed on the splicing position of the non-display areas of the two adjacent first display units are symmetrically arranged.

9. A splicing display device, comprising:
   at least two first display units which are spliced and connected, wherein each of the first display units comprises a non-display area; and
   a second display unit disposed on a light-emitting side of the first display units, and attached and fixed to a splicing position of the non-display areas of the two adjacent first display units;
   a vacuum suction component disposed in the non-display area of one of the first display units and arranged corresponding to the second display unit, wherein the vacuum suction component is configured to attach the second display unit.

10. The splicing display device according to claim 9, wherein further comprising:
    a vacuuming unit disposed on a side of the one of the first display units away from the second display unit, wherein the vacuuming unit is connected to the vacuum suction component, and is configured to vacuum the vacuum suction component.

11. The splicing display device according to claim 10, wherein the vacuum suction component comprises a suction hole, and the suction hole extends in a thickness direction of the first display units; and
    the splicing display device further comprises a connecting pipe, one end of the connecting pipe is connected to the vacuuming unit, and another end of the connecting pipe is inserted into the suction hole.

12. The splicing display device according to claim 10, wherein each of the first display units further comprises:
    a first accommodating slot disposed in the non-display area of the first display unit, disposed on a surface of the first display unit close to the second display unit, and arranged corresponding to the second display unit; and a through hole correspondingly arranged and communicated with the first accommodating slot, and extending in a thickness direction of the first display unit;

wherein the vacuum suction component comprises a vacuum sucker and is disposed in the first accommodating slot; and wherein the splicing display device further comprises a connecting pipe, at least a portion of the connecting pipe is disposed in the through hole, one end of the connecting pipe is connected to the vacuum sucker, and another end of the connecting pipe is connected to the vacuuming unit.

13. The splicing display device according to claim 10, wherein the first display units are liquid crystal display modules, and the second display unit is a light emitting-diode light panel.

14. The splicing display device according to claim 13, wherein each of the first display units comprises a liquid crystal display panel and a backlight module, the backlight module comprises a backplane, the backplane comprises a bottom plate and a side plate arranged along an edge of the bottom plate, the side plate of the backplane is arranged around the liquid crystal display panel, the side plate of the backplane is disposed in the non-display area of the first display unit, and the vacuum suction component is disposed in the side plate.

15. The splicing display device according to claim 10, further comprising: a vacuum valve connected between the vacuum suction component and the vacuuming unit.

16. The splicing display device according to claim 15, wherein a group of the vacuum suction components is correspondingly disposed on the splicing position of the non-display area of one of the two adjacent first display units, the group of the vacuum suction components comprises a plurality of the vacuum suction components, one of the vacuum valves is connected to the group of the vacuum suction components.

17. The splicing display device according to claim 16, wherein two groups of the vacuum suction components respectively disposed on the splicing position of the non-display areas of the two adjacent first display units are symmetrically arranged.

18. The splicing display device according to claim 16, wherein the plurality of the vacuum suction components of the group of the vacuum suction components are arranged side by side along an extending direction of a splicing seam of the splicing position.

19. The splicing display device according to claim 15, wherein each of the first display units comprises a second accommodating slot disposed on a rear surface of the first display unit away from the second display unit;

wherein the vacuum valve is detachably fixed in the second accommodating slot.

20. The splicing display device according to claim 15, further comprising: a rear casing disposed on a back side of light-emitting surfaces of at least two of the first display units which are spliced, wherein the rear casing comprises an accommodating cavity, and the vacuum valve and the vacuuming unit are arranged in the accommodating cavity of the rear casing.

* * * * *